United States Patent
Smith et al.

(10) Patent No.: US 8,338,699 B2
(45) Date of Patent: *Dec. 25, 2012

(54) POLY(VINYL BUTYRAL) ENCAPSULANT COMPRISING CHELATING AGENTS FOR SOLAR CELL MODULES

(75) Inventors: Rebecca L. Smith, Vienna, WV (US); Katherine M. Stika, Hockessin, DE (US); Jason S. Wall, Middletown, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 345 days.

This patent is subject to a terminal disclaimer.

(21) Appl. No.: 12/692,047

(22) Filed: Jan. 22, 2010

(65) Prior Publication Data

US 2010/0180943 A1    Jul. 22, 2010

Related U.S. Application Data

(60) Provisional application No. 61/146,547, filed on Jan. 22, 2009.

(51) Int. Cl.
*H01L 31/00* (2006.01)

(52) U.S. Cl. .................................. 136/256

(58) Field of Classification Search .............. 136/256
See application file for complete search history.

(56) References Cited

U.S. PATENT DOCUMENTS

| | | | |
|---|---|---|---|
| 3,153,009 A | 10/1964 | Rombach | |
| 3,234,062 A | 2/1966 | Morris | |
| 3,311,517 A | 3/1967 | Keslar et al. | |
| 3,841,890 A | 10/1974 | Coaker et al. | |
| 3,852,136 A | 12/1974 | Plumat et al. | |
| 4,017,332 A | 4/1977 | James | |
| 4,144,217 A | 3/1979 | Snelgrove et al. | |
| 4,179,702 A | 12/1979 | Lamorte | |
| 4,276,351 A | 6/1981 | Phillips | |
| 4,292,416 A | 9/1981 | Shue et al. | |
| 4,335,036 A | 6/1982 | Fowell | |
| 4,341,576 A | 7/1982 | Lewis | |
| 4,385,951 A | 5/1983 | Pressau | |
| 4,398,979 A | 8/1983 | Cathers et al. | |
| 4,544,797 A | 10/1985 | Hewig | |
| 4,692,557 A | 9/1987 | Samuelson et al. | |
| 4,696,971 A | 9/1987 | Degeilh | |
| 4,902,464 A | 2/1990 | Cartier et al. | |
| 5,013,779 A | 5/1991 | Fariss et al. | |
| 5,137,954 A | 8/1992 | DasGupta et al. | |
| 5,415,909 A | 5/1995 | Shohi et al. | |
| 5,447,576 A | 9/1995 | Willis | |
| 5,507,881 A | 4/1996 | Sichanugrist et al. | |
| 5,512,107 A | 4/1996 | Van Den Berg | |
| 5,536,347 A | 7/1996 | Moran | |
| 5,853,516 A | 12/1998 | Lehto | |
| 5,886,075 A | 3/1999 | Keane et al. | |
| 5,948,176 A | 9/1999 | Ramanathan et al. | |
| 5,994,163 A | 11/1999 | Bodegard et al. | |
| 6,040,521 A | 3/2000 | Kushiya et al. | |
| 6,123,824 A | 9/2000 | Sano et al. | |
| 6,137,048 A | 10/2000 | Wu et al. | |
| 6,258,620 B1 | 7/2001 | Morel et al. | |
| 6,288,325 B1 | 9/2001 | Jansen et al. | |
| 6,342,116 B1 | 1/2002 | Balduin et al. | |
| 6,613,603 B1 | 9/2003 | Sano | |
| 6,784,301 B2 | 8/2004 | Hackmann et al. | |
| 6,784,361 B2 | 8/2004 | Carlson et al. | |
| 2004/0182493 A1 | 9/2004 | Chick | |
| 2005/0192373 A1 | 9/2005 | Awaji et al. | |
| 2006/0213548 A1 | 9/2006 | Bachrach et al. | |
| 2006/0219294 A1 | 10/2006 | Yabuuchi et al. | |
| 2007/0079866 A1 | 4/2007 | Borden et al. | |
| 2007/0209699 A1 | 9/2007 | Sichanugrist et al. | |
| 2007/0227578 A1 | 10/2007 | Perozziello et al. | |
| 2007/0232057 A1 | 10/2007 | Borden et al. | |
| 2007/0238285 A1 | 10/2007 | Borden | |
| 2007/0240759 A1 | 10/2007 | Borden | |
| 2007/0281090 A1 | 12/2007 | Kurita et al. | |
| 2007/0298590 A1 | 12/2007 | Choi et al. | |

(Continued)

FOREIGN PATENT DOCUMENTS

| | | |
|---|---|---|
| EP | 1235683 B1 | 9/2002 |
| JP | 2002-097041 A | 4/2002 |
| WO | 9101880 A1 | 2/1991 |
| WO | 03057478 A1 | 7/2003 |
| WO | 2004084282 A1 | 9/2004 |
| WO | 2006/093936 A2 | 9/2006 |
| WO | 2007103598 A2 | 9/2007 |
| WO | 2011115628 A1 | 9/2011 |

OTHER PUBLICATIONS

U.S. Appl. No. 13/335,226, filed Dec. 22, 2011.
U.S. Appl. No. 13/335,424, filed Dec. 22, 2011.
PCT Search Report and Written Opinion for International application No. PCT/US2010/021803 dated Mar. 31, 2010.
Extended European search report for Application No. 10733900.4-2102, dated Jun. 11, 2012.

*Primary Examiner* — Nathan M Nutter

(74) *Attorney, Agent, or Firm* — Maria M. Kourtakis; Kelly Law Registry; Tong T. Li

(57) ABSTRACT

Provided is a solar cell module that comprises a solar cell assembly. The solar cell assembly is encapsulated by a poly(vinyl butyral) encapsulant and contains an oxidizable metal component that is at least partially in contact with the poly(vinyl butyral) encapsulant. The poly(vinyl butyral) encapsulant comprises poly(vinyl butyral), about 15 to about 45 wt % of one or more plasticizers, and about 0.5 to about 2 wt % of one or more chelating agent, based on the total weight of the poly(vinyl butyral) encapsulant. Further provided are an assembly for preparing the solar cell module; a process for preventing or reducing the discoloration of a poly(vinyl butyral) encapsulant in contact with an oxidizable metal component in the solar cell module; and the use of the solar cell module to convert solar energy to electricity.

16 Claims, No Drawings

U.S. PATENT DOCUMENTS

| | | |
|---|---|---|
| 2008/0110491 A1 | 5/2008 | Buller et al. |
| 2008/0149176 A1 | 6/2008 | Sager et al. |
| 2008/0185033 A1 | 8/2008 | Kalejs |
| 2008/0185035 A1 | 8/2008 | Hayes |
| 2008/0210287 A1 | 9/2008 | Volpp et al. |
| 2008/0223436 A1 | 9/2008 | Den Boer et al. |
| 2008/0251120 A1 | 10/2008 | Malmstrom et al. |
| 2008/0271675 A1 | 11/2008 | Choi et al. |
| 2008/0276983 A1 | 11/2008 | Drake et al. |
| 2010/0180940 A1 | 7/2010 | Cui |
| 2010/0180942 A1* | 7/2010 | Smith et al. .................. 136/256 |
| 2010/0180947 A1* | 7/2010 | Smith et al. .................. 136/259 |
| 2011/0114159 A1* | 5/2011 | Smith et al. .................. 136/251 |

* cited by examiner

POLY(VINYL BUTYRAL) ENCAPSULANT COMPRISING CHELATING AGENTS FOR SOLAR CELL MODULES

CROSS-REFERENCE TO RELATED APPLICATION

This application claims priority under 35 U.S.C. §119(e) to U.S. Provisional Appln. No. 61/146,547, filed on Jan. 22, 2009, which is incorporated herein by reference in its entirety.

FIELD OF THE INVENTION

The invention is directed to an improved poly(vinyl butyral) composition useful as an encapsulant material for solar cell modules. In particular, the poly(vinyl butyral) encapsulant comprises one or more chelating agents.

BACKGROUND OF THE INVENTION

Several patents and publications are cited in this description in order to more fully describe the state of the art to which this invention pertains. The entire disclosure of each of these patents and publications is incorporated by reference herein.

The use of solar cells is rapidly expanding because they provide a sustainable energy resource. Solar cells can typically be categorized into two types based on the light absorbing material used, i.e., bulk or wafer-based solar cells and thin film solar cells.

Monocrystalline silicon (c-Si), poly crystalline (poly-Si), multicrystalline silicon (mc-Si) and ribbon silicon are the materials used most commonly in forming the more traditional wafer-based solar cells. Solar cell modules derived from wafer-based solar cells often comprise a series of about 180 and about 240 µm thick self-supporting wafers (or cells) that are soldered together. Such a panel of solar cells, along with a layer of conductive paste and/or conducting wires and bus bars deposited on its surface, is then encapsulated by polymeric encapsulants to form a solar cell assembly, which may be further sandwiched between two protective outer layers to form a weather resistant module. The protective outer layers may be formed of glass, metal sheets or films, or plastic sheets or films. In general, however, the outer layer that faces to the sunlight needs to be sufficiently transparent to allow photons to reach the solar cells.

As for the increasingly important alternative, thin film solar cells, the commonly used materials include amorphous silicon (a-Si), microcrystalline silicon (µc-Si), cadmium telluride (CdTe), copper indium selenide ($CuInSe_2$ or "CIS"), copper indium/gallium diselenide ($CuIn_xGa_{(1-x)}Se_2$ or "CIGS"), light absorbing dyes, organic semiconductors, etc. By way of example, thin film solar cells are described in U.S. Pat. Nos. 5,507,881; 5,512,107; 5,948,176; 5,994,163; 6,040,521; 6,123,824; 6,137,048; 6,288,325; 6,258,620; 6,613,603; and 6,784,301; and U.S. Patent Application Publication Nos. 20070298590; 20070281090; 20070240759; 20070232057; 20070238285; 20070227578; 20070209699; 20070079866; 20080223436; and 20080271675. Thin film solar cells with a typical thickness of less than 2 µm are generally produced by depositing the semiconductor materials onto a substrate in multi-layers. The substrate may be formed of glass or a flexible film, and it may be referred to as a "superstate" in those modules in which it faces the sunlight. Similarly to wafer-based solar cell modules, the thin film solar cells are further encapsulated by polymeric encapsulants and sandwiched between protective outer layers. In certain modules, the only the side of the thin film solar cell that is opposite from the substrate is encapsulated by the polymeric encapsulants and further laminated to a protective outer layer. Further, conducting wirings and bus bars, metal conductive coatings, and/or metal reflector films may be deposited over the surface of the thin film solar cells and encapsulated, along with the thin film solar cells, by the encapsulants.

Within the solar cell modules, some components, such as the conducting wires and bus bars, the conductive paste that is used in wafer-based solar cell modules, the conductive coatings that are used in thin film solar cells, and the back reflector films that are used in thin film solar cell modules, may comprise metals, such as silver. Moreover, these metal-comprising component(s) may come in contact with the polymeric encapsulants. In those modules in which poly(vinyl butyral) (PVB) is used as the encapsulant material, it is found that the PVB tends to discolor over time, when in contact with an oxidizable metal component. Thus, there is a need to develop a PVB composition useful as an encapsulant material for solar cell modules that resists discoloration when in contact with oxidizable metal components over the life of the solar cell module.

SUMMARY OF THE INVENTION

Provided herein is a solar cell module comprising a solar cell assembly. The solar cell assembly is encapsulated by a poly(vinyl butyral) encapsulant and contains an oxidizable metal component that is at least partially in contact with the poly(vinyl butyral) encapsulant. The poly(vinyl butyral) encapsulant comprises poly(vinyl butyral), about 15 to about 45 wt % of one or more plasticizers, and about 0.5 to about 2 wt % of one or more chelating agents, based on the total weight of the poly(vinyl butyral) encapsulant.

Preferably, the oxidizable metal component comprises one or more oxidizable metals or one or more alloys of one or more oxidizable metals. More preferably the oxidizable metal or metal alloy is selected from the group consisting of silver, cerium, copper, aluminum, zirconium, titanium, tin, lead, and combinations of two or more of these metals, and alloys containing any of these metals. Still more preferably, the oxidizable metal is silver. In another preferred module, the oxidizable metal is an alloy containing silver, preferably an alloy containing substantial amounts of silver.

Preferably, the oxidizable metal component is selected from the group consisting of conductive pastes, conducting wires, bus bars, conductive coatings or reflector films. In one preferred module, the oxidizable metal component is a reflector film comprising silver or a silver alloy.

Also preferably the poly(vinyl butyral) comprises up to about 1.5 wt %, more preferably up to about 1.2 wt %, of the chelating agent, based on the total weight of the poly(vinyl butyral) encapsulant. More preferably the poly(vinyl butyral) encapsulant comprises at least about 0.6 wt % of the chelating agent, based on the total weight of the poly(vinyl butyral) encapsulant.

Further provided are an assembly for preparing the solar cell module; a process for preventing or reducing the discoloration of a poly(vinyl butyral) encapsulant in contact with an oxidizable metal component in the solar cell module; and the use of the solar cell module to convert solar energy to electricity.

DETAILED DESCRIPTION OF THE INVENTION

Unless otherwise defined, all technical and scientific terms used herein have the same meaning as commonly understood by one of ordinary skill in the art to which this invention belongs. In case of conflict, the specification, including definitions, will control Although methods and materials similar or equivalent to those described herein can be used in the practice or testing of the invention, suitable methods and materials are described herein.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

The transitional phrase "consisting essentially of" limits the scope of a claim to the specified materials or steps and those that do not materially affect the basic and novel characteristic(s) of the claimed invention.

Where applicants have defined an invention or a portion thereof with an open-ended term such as "comprising," it should be readily understood that unless otherwise stated the description should be interpreted to also describe such an invention using the terms "consisting essentially of" and "consisting of".

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

As used herein, the term "copolymer" refers to polymers comprising copolymerized units resulting from copolymerization of two or more comonomers. Such copolymers include dipolymers, terpolymers or higher order copolymers. In this connection, a copolymer may be described herein with reference to its constituent comonomers or to the amounts of its constituent comonomers, for example "a copolymer comprising ethylene and 15 weight % of acrylic acid", or a similar description. Such a description may be considered informal in that it does not refer to the comonomers as copolymerized units; in that it does not include a conventional nomenclature for the copolymer, for example International Union of Pure and Applied Chemistry (IUPAC) nomenclature; in that it does not use product-by-process terminology; or for another reason. As used herein, however, a description of a copolymer with reference to its constituent comonomers or to the amounts of its constituent comonomers means that the copolymer contains copolymerized units (in the specified amounts when specified) of the specified comonomers. It follows as a corollary that a copolymer is not the product of a reaction mixture containing given comonomers in given amounts, unless expressly stated in limited circumstances to be such.

The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. When the term "about" is used in describing a value or an end-point of a range, the disclosure should be understood to include the specific value or end-point referred to.

The term "or", as used herein, is inclusive; that is, the phrase "A or B" means "A, B, or both A and B". More specifically, a condition "A or B" is satisfied by any one of the following: A is true (or present) and B is false (or not present); A is false (or not present) and B is true (or present); or both A and B are true (or present). Exclusive "or" is designated herein by terms such as "either A or B" and "one of A or B", for example.

Finally, when materials, methods, or machinery are described herein with the term "known to those of skill in the art", "conventional" or a synonymous word or phrase, the term signifies that materials, methods, and machinery that are conventional at the time of filing the present application are encompassed by this description. Also encompassed are materials, methods, and machinery that are not presently conventional, but that will have become recognized in the art as suitable for a similar purpose.

Provided herein is an improved poly(vinyl butyral) (PVB) composition useful as an encapsulant material in solar cell modules. The poly(vinyl butyral) composition comprises a poly(vinyl butyral) resin. The amount of the poly(vinyl butyral) resin in the encapsulant composition is determined by difference with respect to the other components of the encapsulant composition, but in general ranges from about 40 to about 80 wt %. Poly(vinyl butyral) (PVB) is a vinyl resin resulting from the condensation of poly(vinyl alcohol) with butyraldehyde. The PVB may be produced by aqueous or solvent acetalization. In a solvent process, acetalization is carried out in the presence of sufficient solvent to dissolve the PVB and produce a homogeneous solution at the end of acetalization. The PVB is separated from solution by precipitation of solid particles with water, which are then washed and dried. Solvents used are lower aliphatic alcohols such as ethanol. In an aqueous process, acetalization is carried out by adding butyraldehyde to a water solution of poly(vinyl alcohol) at a temperature of about 20° C. to about 100° C., in the presence of an acid catalyst, agitating the mixture to cause an intermediate PVB to precipitate in finely divided form and continuing the agitation while heating until the reaction mixture has proceeded to the desired end point, followed by neutralization of the catalyst, separation, stabilization and drying of the PVB. For example, PVB can be produced as described in U.S. Pat. Nos. 3,153,009 and 4,696,971.

Suitable PVB resins have a weight average molecular weight of about 30,000 Da, or about 45,000 Da, or about 200,000 Da to about 600,000 Da, or about 300,000 Da, as determined by size exclusion chromatography using low angle laser light scattering. The PVB may comprise about 12 wt %, or about 14 wt %, or about 15 wt %, to about 23 wt %, or about 21 wt %, or about 19.5 wt %, or about 19 wt % of hydroxyl groups calculated as polyvinyl alcohol (PVOH). The hydroxyl number may be determined according to standard methods, such as ASTM D1396-92 (1998). In addition, suitable PVB resins may include up to about 10%, or up to about 3%, of residual ester groups, calculated as polyvinyl ester, typically acetate groups, with the balance being butyraldehyde acetal. The PVB may further comprise a minor amount of acetal groups other than butyral, for example, 2-ethyl hexanal, as described in U.S. Pat. No. 5,137,954.

The poly(vinyl butyral) composition further comprises one or more plasticizers at a level of about 15 wt %, or about 20 wt %, or about 25 wt % to about 45 wt %, or about 35 wt %, or about 30 wt %, based on the total weight of the PVB composition. Any plasticizer known in the art may be suitable for use in the PVB compositions described herein. See, e.g., U.S. Pat. Nos. 3,841,890; 4,144,217; 4,276,351; 4,335,036; 4,902,464; 5,013,779; and 5,886,075. Among those commonly used plasticizers are esters of a polybasic acid or a polyhydric alcohol. In one encapsulant composition, the plasticizers used here may include, but are not limited to, diesters obtained from the reaction of triethylene glycol or tetraethylene glycol with aliphatic carboxylic acids having from 6 to 10 carbon atoms; diesters obtained from the reaction of sebacic acid with aliphatic alcohols having from 1 to 18 carbon atoms; oligoethylene glycol di-2-ethylhexanoate; tetraethylene glycol di-n-heptanoate; dihexyl adipate; dioctyl adipate; dibutoxy ethyl adipate; mixtures of heptyl and nonyl adipates; dibutyl sebacate; tributoxyethylphosphate; isodecylphenylphosphate; triisopropylphosphite; polymeric plasticizers, such as, the oil-modified sebacid alkyds; mixtures of phosphates and adipates; mixtures of adipates and alkyl benzyl phthalates; and combinations of two or more of these plasticizers. In other preferred encapsulant compositions, the plasticizer(s) include, but are not limited to, one or more of: triethylene glycol di-2-ethylhexanoate, tetraethylene glycol di-n-heptanoate, dibutyl sebacate, and combinations of two or more thereof. In still other preferred encapsulant compositions, the plasticizer(s) include, but are not limited to, one or more of: triethylene glycol di-2-ethylhexanoate, tetraethylene glycol di-n-heptanoate, and combination of two or more thereof. In still other preferred encapsulant compositions, the plasticizer is triethylene glycol di-2-ethyl-hexanoate.

The poly(vinyl butyral) composition further comprises one or more chelating agents at a level ranging from about 0.5 wt %, or about 0.6 wt %, or about 0.7 wt %, or about 0.8 wt % to about 2 wt %, or about 1.5 wt %, or about 1.2 wt %, or about 1 wt %, based on the total weight of the PVB composition. The chelating agents used here include, but are not limited to, ethylenediamine-tetraacetic acid (EDTA), ethylenediamine monoacetic acid, ethylenediamine diacetic acid, ethylenediamine triacetic acid, ethylene diamine, tris(2-aminoethyl) amine, diethylenetriaminepentacetic acid, or mixtures of any thereof. In one preferred encapsulant composition, the PVB composition comprises EDTA.

Moreover, the PVB composition may further comprise one or more UV absorbers at a level ranging from about 0.01 wt %, or about 0.05 wt %, or about 0.08 wt % to about 1 wt %, or about 0.8 wt %, or about 0.5 wt %, based on the total weight of the PVB composition. UV absorbers are well-known in the art. Any known UV absorber may find utility in the PVB composition. Examples of suitable UV absorbers include, but are not limited to, benzotriazole derivatives, hydroxybenzophenones, hydroxyphenyl triazines, esters of substituted and unsubstituted benzoic acids, and mixtures of any thereof. Commercially available UV absorbers that can be used here include, but are not limited to, Tinuvin™ P, Tinuvin™ 1130, Tinuvin™ 326, Tinuvin™ 327, Tinuvin™ 328, Tinuvin™ 571, Tinuvin™ 99-DW, or Chimassorb™ 81, manufactured by Ciba, Uvinul™ 3000, Uvinul™ 3008, Uvinul™ 3040, or Uvinul™ 3050, manufactured by BASF (Ludwigshafen, Germany), Cyasorb™ 5411, manufactured by Cytec Industries, Inc., or a combination of any two or more of these UV absorbers.

The PVB composition may further comprise one or more thermal stabilizers at a level ranging from about 0.01 wt %, or about 0.05 wt %, or about 0.08 wt % to about 1 wt %, or about 0.8 wt %, or about 0.5 wt %, based on the total weight of the PVB composition. The thermal stabilizers may also be referred to as phenolic antioxidants and are well known in the industry. Examples of suitable thermal stabilizers include, but are not limited to, Irganox™ 1010, Irganox™1035, Irganox™ 1076, Irganox™ 1081, Irganox™ 1098, Irganox™ 1135, Irganox™ 1330, Irganox™ 1425 WL, Irganox™ 1520, Irganox™ 245, Irganox™ 3114, Irganox™ 565, Irganox™ E 201, or Irganox™ MD 1024 manufactured by Ciba, Lowinox™ 1790, Lowinox™ 22M46, Lowinox™ 44B25, Lowinox™ CA22, Lowinox™ CPL, Lowinox™ HD 98, Lowinox™ MD24, Lowinox™ TBM-6, or Lowinox™ WSP, manufactured by Chemtura (Middlebury, Conn.), Cyanox™ 1741, Cyanox™ 2246, or Cyanox™ 425, manufactured by Cytec, or a combination of any two or more of these thermal stabilizers. In one preferred PVB composition, the thermal stabilizer comprises one or more of Lowinox™ 1790, Lowinox™ 22M46, Lowinox™ 44B25, Lowinox™ CA22, Lowinox™ CPL, Lowinox™ HD 98, Lowinox™ MD24, Lowinox™ TBM-6, or Lowinox™ WSP. In another preferred PVB composition, the thermal stabilizer octylphenol. In yet another preferred PVB composition, the thermal stabilizer is butylated hydroxytoluene (BHT).

The PVB composition may further comprise one or more hindered amines at a level of up to 1 wt %. For UV stability hindered amines are typically added in an amount of about 0.001 wt % to about 0.1 wt %, %, based on the total weight of the PVB composition. Higher amounts can be added to help prevent yellowing. For this purpose, hindered amines are preferably added in an amount ranging from about 0.08 wt %, or about 0.1 wt %, or greater than 0.1 wt %, to about 1 wt %, to about 0.8 wt %, or up to about 0.5 wt %, based on the total weight of the PVB composition. The hindered amines may be secondary or tertiary hindered amines. Examples of suitable secondary hindered amines include, but are not limited to, 2,2,6,6-tetramethylpiperadine, 2,2,6,6-tetramethylpiperadinol, and mixtures thereof. Examples of suitable tertiary hindered amines include, but are not limited to, 2-(dimethylamino) pyridine, 4-(dimethylamino) pyridine, N-butyl piperidine, N,N-diethyl cyclohexylamine, and mixtures of any thereof. In one preferred module, the hindered amines are hindered amine light stabilizers (HALS), which are typically secondary, tertiary, acetylated, N-hydrocarbyloxy substituted, hydroxy substituted, N-hydrocarbyloxy substituted, or other substituted cyclic amines which further incorporate steric hindrance, generally derived from aliphatic substitution on the carbon atoms adjacent to the amine function. HALS are well known within the art and commercially available. For example, Tinuvin™ 111, Tinuvin™ 123, Tinuvin™ 144, Tinuvin™ 152, Tinuvin™ 292, Tinuvin™ 622, Tinuvin™ 765, Tinuvin™ 770, Tinuvin™ 783, Tinuvin™791, Chimassorb™ 119, Chimassorb™ 2020, or Chimassorb™ 944, manufactured by Ciba (Tarrytown, N.Y.), Cyasorb™ 3346 or Cyasorb™ 3853S manufactured by Cytec Industries, Inc. (Paterson, N.J.), or a combination of any two or more of these HALS can be used in the PVB compositions described herein. Further information regarding suitable hindered amines and their use in encapsulant compositions may be found in U.S. Appln. Publn. No. US-2010-0180942-A1 by Smith et al.

The PVB composition may further comprise one or more unsaturated heterocyclic compounds at a level ranging from about 0.01 wt %, or about 0.05 wt %, or about 0.08 wt % to about 1 wt %, or about 0.8 wt %, or about 0.5 wt %, based on the total weight of the PVB composition. Examples of suitable unsaturated heterocyclic compounds include, but are not limited to, triazole, imidazole, pyrrole, pyridine, purine, pyrazine, adenine, triazine, benzotriazole, benzothiazole, benzoxazole, 2,2'-dipyridyl, 2-mercaptobenzimidazole, thiazole, and a combination of any two or more of these unsaturated heterocyclic compounds. The term "benzotriazole", as used in the present context, refers to the compound itself, and does not include the benzotriazole derivatives that can be used as UV absorbers and which are sometimes referred to as "benzotriazole UV absorbers". Further information regarding suitable unsaturated heterocyclic compounds and their use in encapsulant compositions may be found in U.S. Patent Appln. Publn. No. US-2010-0180947-A1 by Smith et al.

In addition to the plasticizers and the additives described above, the PVB composition may further comprise one or more other suitable additives, including but not limited to adhesion control additives, surface tension controlling agents, processing aids, flow enhancing additives, lubricants, pigments, dyes, flame retardants, impact modifiers, nucleating agents, anti-blocking agents such as silica, dispersants, surfactants, coupling agents, reinforcement additives, such as glass fiber, fillers and the like. These additives are described in the *Kirk Othmer Encyclopedia of Chemical Technology*, $5^{th}$ Edition, John Wiley & Sons (New Jersey, 2004), for example.

These other additives may be present in the compositions in quantities that are generally from 0.01 to 15 weight %, preferably from 0.01 to 10 weight % or from 0.01 to about 5 weight %, or from 0.1 to about 1.0 weight %, based on the total weight of the PVB composition, so long as they do not detract from the basic and novel characteristics of the PVB composition and further do not significantly adversely affect the performance of the composition or of the solar cell modules prepared from the composition. The optional incorporation of these conventional ingredients into the PVB compositions can be carried out by any known process, for example, by dry blending, by extruding a mixture of the various constituents, by a masterbatch technique, or the like. See, again, the *Kirk-Othmer Encyclopedia*.

Further described herein is a solar cell module that comprises a solar cell assembly, wherein (A) the solar cell assembly comprises an oxidizable metal component; (B) the solar cell assembly is encapsulated by the PVB composition described above; and (C) the oxidizable metal component is at least partially in contact with the PVB encapsulant.

The term "metal component", as used herein, refers to a constituent part or to any sub-combination of the constituent parts of the solar cell assembly or of the solar cell module that comprises elemental metal, such as the conductive paste, the conducting wires or bus bars, the metal conductive coatings, or the metal reflector films. In particular, the terms "elemental metal", "metallic [element]", and "$M^0$", for example, "elemental iron", "metallic iron" and "$Fe^0$", are synonymous and are used interchangeably herein. The elemental metal may be present in substantially neat or pure form, for example as silver is used in a reflector film. Alternatively, it may be compounded, for example with a non-metallic material such as a carrier or a filler, or it may be present in a solid solution, in an alloy, in crystalline form, as a powder or as a flake, as the continuous or dispersed phase of a dispersion, or in any other morphology. For example, the solder material used in some connecting wires is a silver and aluminum alloy containing as little as about 2 wt % of silver.

Specific types of metal components include conductive paste, which is typically used in wafer-based solar cells, is a conductive film deposited on the front sun-facing side of solar cells to efficiently contacting the solar cells and transporting the photo-generated current.

Other metal components include conducting wires and bus bars, which may be included in both wafer-based solar cells and thin film solar cells, are typically soldered on the surface of the solar cells to provide electrical connections between individual solar cells and to lead the photo-generated current out of the modules.

In addition, during the construction of thin film solar cells, a first conductive layer (e.g., a transparent conductive oxide (TCO) or metal coating) is first coated on the substrate before the photon absorbing materials are deposited thereon. Further, during the construction of the solar cells, a second conductive layer (e.g., a TCO or metal coating) is further deposited on the photon absorbing materials. The oxidizable metal component referred to here may be one or both of the two metal conductive coatings described above.

Metal back reflector films are often incorporated in thin film solar cells to bounce the photons back into the solar cell and therefore improve power generating efficiency.

In the solar cell modules described herein, the oxidizable metal component is completely or partially in contact with the PVB encapsulant. For instance, in some modules the term "partially in contact with" indicates that the oxidizable component has at least about $3.6 \times 10^{-5}$% of its surface area in contact with the PVB encapsulant. This amount was calculated relative to scribe lines in thin film cells, although it approximates a minimum surface area contact for many other types of metal component. In contrast, the metal component may be completely in contact with the encapsulant, for example in a solar cell module in which substantially 100% of the surface area of a silver reflector film is in contact with a PVB encapsulant. When used without modification, however, as in the term "the silver component is in contact with the PVB encapsulant," for example, any non-zero level of contact is indicated. Stated alternatively, any non-zero percentage of the component's surface area may be in contact with the PVB encapsulant.

In one module, the oxidizable metal component comprises an oxidizable metal or an oxidizable metal alloy. In particular, the metals are oxidizable under the normal operating conditions of the solar cell module. Some preferred oxidizable metals are oxidizable when held under a bias of 1,000 volts for 1000 hours at 85° C. and at 85% relative humidity, in contact with the polymer encapsulant that is used in the solar cell module. Examples of suitable oxidizable metals include, but are not limited to, silver, cerium, copper, aluminum, zirconium, titanium, bismuth, cadmium, copper, lead, silver, tin, lead and zinc. The oxidizable metals also include oxidizable metal alloys containing the foregoing metals or combinations of two or more of these metals, particularly alloys that contain substantial amounts of those metals. In particular, the PVB composition described herein may prevent or reduce discoloration of PVB encapsulant that comes into contact with silver or alloys containing silver. Accordingly, in a preferred module, the oxidizable metal component comprises silver.

More specifically, it has been found that, within a solar cell module, when a prior art PVB encapsulant is in complete or partial contact with an oxidizable metal component, the PVB encapsulant tends to discolor over time. Without wishing to be held to theory, it is believed that the metal becomes oxidized and its cations migrate into the PVB under high voltage and high moisture conditions. By adding a chelating agent and optionally the other additives described above into the PVB encapsulants, one or more of the oxidation, the migration or the discoloration is mitigated or prevented.

When the PVB encapsulant described herein is used in a solar cell module and is in contact with one or more silver components, the yellowness index (YI) change of the PVB encapsulant over time is reduced or minimized. The YI change for a PVB encapsulant can be calculated by testing sample sheets of PVB after 1000 hours 85% relative humidity (RH), 85° C., and bias (100 to 1,000 V). Alternatively, the YI for a PVB encapsulant can be determined in accordance with ASTM E313-05, using a 2° observer and using Illuminant C as a light source. These conditions may also be described as "2°/C". The YI is reported in unitless numbers and must be normalized to a particular sample pathlength for direct comparison. In general, the YI of PVB encapsulants described herein remains about 60 or less, or about 55 or less, or about 50 or less, or 40 or less, or about 30 or less, or about 20 or less, for a sample having a pathlength of 1.0 cm. Also preferably, the YI of the PVB encapsulant described herein changes less than 500%, less than 350%, less than 200%, less than 100%, less than 50%, less than 25% or less than 10%, under test conditions or under solar cell module operating conditions, compared to a PVB encapsulant that does not include a chelating agent.

Preferred encapsulants are poly(vinyl butyral) sheets comprising the PVB composition described herein and having a thickness of about 0.25 mm to about 1.2 mm and comprising about 15 to about 45 wt % of plasticizer and about 0.5 to about 2 wt % of chelating agent, based on the total weight of the poly(vinyl butyral) sheet. Also preferably, the poly(vinyl butyral) sheet has a yellowness index of about 60 or less in accordance with ASTM E313-05 after 1000 hours at 85% relative humidity (RH) and at 85° C. with a bias of 1,000 V.

When the oxidizable metal is not silver, the optical effect of the metal on the encapsulant may be other than yellowing. For example, the metal contact may cause cloudiness in the film, or it may cause discoloration to a color other than yellow. In these instances, the effect of the encapsulants described herein may be quantified by methods such as clarity measurements, electron microscopy, and optical spectroscopy. For example, for a metal that causes discoloration to a color other than yellow, a method analogous to the determination of YI may be used, with the exception that a different range of visible wavelengths will be observed.

The term "solar cell" as used herein includes any article that can convert light into electrical energy. Solar cells useful in the invention include, but are not limited to, wafer-based solar cells (e.g., c-Si or mc-Si based solar cells), thin film solar cells (e.g., a-Si, μc-Si, CdTe, or CI(G)S based solar cells), and organic solar cells that comprise materials such as light absorbing dyes or organic semiconductors.

In one preferred module, the solar cells are wafer-based solar cells, and the oxidizable metal component is a conductive paste deposited thereon or conducting wires or bus bars soldered thereon. The metal component is completely or partially in contact with the PVB encapsulant described above. Further, the solar cell assembly, which comprises the wafer-based solar cells and the oxidizable metal component, is encapsulated by the PVB encapsulant and may be further sandwiched between two protective outer layers. The protective outer layers are also referred to as the front and back sheets, and they may be formed of any suitable sheets or films.

Suitable sheets include, without limitation, glass sheets, metal sheets such as aluminum, steel, galvanized steel, ceramic plates, or plastic sheets, such as polycarbonates, acrylics, polyacrylates, cyclic polyolefins (e.g., ethylene norbornene polymers), polystyrenes (preferably polystyrenes prepared in the presence of metallocene catalysts), polyamides, polyesters, fluoropolymers, or combinations of two or more thereof.

Suitable films include, without limitation, metal films, such as aluminum foil, or polymeric films such as those comprising polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, silicones, poly(vinyl chlorides) (e.g., poly(vinylidene chloride)), fluoropolymers (e.g., polyvinyl fluoride, polyvinylidene fluoride, polytetrafluoroethylene, ethylene-tetrafluoroethylene copolymers, etc.), or combinations of two or more thereof. The polymeric film may be non-oriented, or uniaxially oriented, or biaxially oriented.

Some specific examples of suitable polymeric films include, but are not limited to, polyester films (e.g., poly (ethylene terephthalate) films), fluoropolymer films (e.g., Tedlar®, Tefzel®, and Teflon® films available from E. I. du Pont de Nemours and Company (DuPont), Wilmington, Del.). Further multi-layer films, such as a fluoropolymer/polyester/fluoropolymer multilayer film (e.g., the Tedlar® film/PET film/Tedlar® film laminate composite (TPT)) may also be used.

In another preferred module, the solar cells are thin film solar cells with the light absorbing materials deposited on a substrate in layers. The substrate may be made of glass, or any suitable metal or polymeric sheets or films as described above for the protective outer layers. The thin film solar cells may be single-junction or multi-junction (including tandem junction) thin film solar cells. As the spectrum of solar radiation provides photons of varying energies, multi-junction solar cells were developed in which the sunlight passes serially through several solar cell layers. Each separate layer of the multi-junction solar cell is tailored to convert photons of a specific wavelength efficiently to electrical energy. The multi-junction solar cells are usually constructed with layers of different energy gaps. The layers having greater energy gaps are adjacent to the surface through which the light enters the module. The layers having lesser energy gaps are positioned further towards the interior or back of the module. In principle, any types of solar cells known with the art is useful here, and they include, but are not limited to, those described in U.S. Pat. Nos. 4,017,332; 4,179,702; 4,292,416; 6,123,824; 6,288,325; 6,613,603; and 6,784,361, U.S. Patent Application Publication Nos. 2006/0213548; 2008/0185033; 2008/0223436; 2008/0251120; and 2008/0271675; and PCT Patent Application Nos. WO2004/084282 and 2007/103598.

In the thin film solar cell modules, the oxidizable metal component may be selected from conducting wires, bus bars, conductive coatings, or back reflector films, or a combination of two or more thereof. Again, the metal component is completely or partially in contact with the PVB encapsulant described above. In one module, the oxidizable metal component is a conductive coating comprising silver or a silver alloy. The oxidizable metal component may also be a back reflector film comprising silver or a silver alloy. Further, the module which comprises the thin film solar cell material and the oxidizable metal component deposited on the substrate at one side and encapsulated by the PVB encapsulant on the other side may further comprise a protective outer layer laminated to the PVB encapsulant.

Any suitable process may be used in preparing the solar cell modules described herein. In particular, any suitable lamination process known within the art (such as an autoclave or a non-autoclave process) may be used to prepare the solar cell modules. For example, in a typical lamination process, the solar cells are first stacked between the PVB encapsulants (e.g., in the form of PVB sheets), and further between two protective films or sheets, and this pre-lamination assembly is then subjected to the lamination process. Further, in the preparation of thin film solar cell modules, the solar cells, which are deposited over a substrate, are first stacked over the PVB encapsulant (e.g., in the form of a PVB sheet) and then stacked over a protective film or sheet to form a pre-lamination assembly.

Accordingly, further provided herein is a pre-lamination assembly for preparing a solar cell module. The pre-lamination assembly comprises a solar cell assembly, which in turn comprises a solar cell, an oxidizable metal component, and a poly(vinyl butyral) sheet comprising the PVB composition described herein. Preferably, the poly(vinyl butyral) sheet has a thickness of about 0.25 mm to about 1.2 mm and a yellowness index of about 60 or less in accordance with ASTM E313-05 after 1000 hours at 85% relative humidity (RH) and at 85° C. with a bias of 1,000 V. The pre-lamination assembly may further comprise one or more additional layers selected from the group consisting of: a second poly(vinyl butyral) sheet that may be the same as or different from the poly(vinyl butyral) sheet, said second poly(vinyl butyral) sheet being in contact with the solar cell assembly; a protective outer layer that is in contact with the poly(vinyl butyral) sheet; a second protective outer layer that may be the same as or different from the protective outer layer, said second protective outer layer in contact with the second poly(vinyl butyral) sheet; and a substrate or a superstrate that is in contact with the solar cell assembly and with the poly(vinyl butyral) sheet.

In one suitable process, the pre-lamination assembly is placed into a bag capable of sustaining a vacuum ("a vacuum bag"), the air is drawn out of the bag by a vacuum line or other means, and the bag is sealed while the vacuum is maintained (e.g., at least about 27-28 in Hg (689-711 mm Hg)). The sealed bag is placed in an autoclave at a pressure of about 150 to about 250 psi (about 11.3 to about 18.8 bar) and at a temperature of about 130° C. to about 180° C., or about 120° C. to about 160° C., or about 135° C. to about 160° C., or about 145° C. to about 155° C. These conditions are held for a period of about 10 to about 50 min, or about 20 to about 45 min, or about 20 to about 40 min, or about 25 to about 35 min. A vacuum ring may be substituted for the vacuum bag. One suitable type of vacuum bag is described in U.S. Pat. No. 3,311,517. Following the heat and pressure cycle, the air in the autoclave is cooled without adding additional gas to maintain pressure in the autoclave. After about 20 min of cooling, the excess air pressure is vented and the laminates are removed from the autoclave.

Alternatively, the pre-lamination assembly may be heated in an oven at about 80° C. to about 120° C., or about 90° C. to about 100° C., for about 20 to about 40 min, and thereafter, the heated assembly is passed through a set of nip rolls so that the air in the void spaces between the individual layers may be squeezed out, and the edge of the assembly sealed. The pre-lamination assembly at this stage is referred to as a pre-press assembly.

The pre-press assembly may then be placed in an air autoclave in which the temperature is raised to about 120° C. to about 160° C., or about 135° C. to about 160° C., at a pressure of about 100 to about 300 psi (about 6.9 to about 20.7 bar), or preferably about 200 psi (13.8 bar). These conditions are maintained for about 15 to about 60 min, or about 20 to about 50 min, after which the air is cooled while no more air is added to the autoclave. After about 20 to about 40 min of cooling, the excess air pressure is vented and the laminated products are removed from the autoclave.

The solar cell modules may also be produced through non-autoclave processes. Suitable non-autoclave processes are described, e.g., in U.S. Pat. Nos. 3,234,062; 3,852,136; 4,341,576; 4,385,951; 4,398,979; 5,536,347; 5,853,516; 6,342,116; and 5,415,909, U.S. Patent Publication No. 20040182493, European Patent No. EP1235683 B1, and PCT Patent Publication Nos. WO9101880 and WO03057478. Generally, the non-autoclave processes include heating the pre-lamination assembly and the application of vacuum, pressure or both. For example, the assembly may be successively passed through heating ovens and nip rolls. These examples of lamination processes are not intended to be limiting. Essentially any lamination process may be used.

Further provided herein is a solar cell array comprising two or more of the solar cell modules described above.

Further provided herein is a process for converting solar energy to electricity. The process includes the steps of providing a closed electrical circuit comprising the solar cell module described herein, electrical connections such as wires, and an electrical load such as a resistor, capacitor, motor, or light source, e.g., light bulb or LED; and exposing the solar cell module to solar radiation. The electrical current produced by the solar cell module circulates through the electrical load and causes it to operate.

Further provided herein is a process of reducing or preventing discoloration of the poly(vinyl butyral) encapsulant in a solar cell module. The solar cell module comprises a solar cell assembly that comprises a oxidizable metal component in complete or partial contact with the poly(vinyl butyral) encapsulant described herein. The process includes the steps of providing a solar cell module as described herein and operating the solar cell module for a period of time under a set of conditions. In the solar cell module described herein, the yellowness index of the PVB encapsulant will be unchanged after the period of operation. Alternatively, the change in its yellowness index after the period of operation will be smaller than the change in the yellowness index of a PVB encapsulant that does not comprise a chelating agent, after the same period of operation under the same set of conditions in a second solar cell module that is otherwise substantially identical to the solar cell module described herein.

The following examples are provided to describe the invention in further detail. These examples, which set forth a preferred mode presently contemplated for carrying out the invention, are intended to illustrate and not to limit the invention.

EXAMPLES

Control Example CE1

A Butacite® PVB sheet commercially available from DuPont comprised 26.7 wt % triethyleneglycol di-2-ethylhexanoate, 0.1 wt % of Tinuvin® P Benzotriazole UV Absorber (Ciba), 0.003 wt % of Tinuvin® 123 hindered amine light stabilizer (HALS) (Ciba), and 0.22 wt % octylphenol, based on the total weight of the PVB composition, was laminated to a silver coated glass lite at the silver coated side. After 1000 hours of conditioning under a bias at 85% RH and 85° C., the PVB sheet changed color from near water white to dark brown.

In this connection, it is noted that the distinction between "benzotriazole UV absorbers" such as Tinuvin®P and unsaturated heterocycles is described in detail above.

Control Examples CE2 to CE6 and Example CE1

In these examples, solutions of PVB ($6.9 \times 10^{-5}$ mol; molecular weight approximately 145,000 Da; 18.8 wt % OH; less than 1.5% vinyl acetate), silver nitrate ($1.2 \times 10^{-5}$ mol), and additive(s) were prepared by dissolving silver nitrate and the additive, if any, in methanol and then adding the silver nitrate solution into a methanolic PVB flake solution. The solution was then heated to 60° C. for two to eight hours and its color change was monitored. The color change was measured on a HunterLab Ultrascan Colorimeter (Hunter Labs, Reston, Va.). Yellowness index (YI) was calculated by ASTM E313-05 and summarized in Table 1.

TABLE 1

| Sample | Chelating Agent | Other Additive | YI |
|---|---|---|---|
| CE2 | — | — | 290.1 |
| CE3 | — | Tinuvin ® P Benzotriazole UV Absorber* $2.6 \times 10^{-5}$ mol | 139.7 |
| CE4 | — | Tinuvin ® 326 Benzotriazole UV Absorber* $6.1 \times 10^{-6}$ mol | 175.8 |
| CE5 | — | Octylphenol** $2.88 \times 10^{-4}$ mol | 197.6 |
| CE6 | — | N,N-Diethylcyclohexylamine** $1.3 \times 10^{-3}$ mol | 151.2 |
| E1 | Ethylenediamine tetraacetic acid (EDTA)** $1.1 \times 10^{-3}$ mol | — | 41.6 |

Notes:
*Ciba, Tarrytown, NY.
**Sigma Aldrich, St. Louis, MO.

The results in Table 1 show that Example E1, which includes a chelating agent (specifically, ethylenediamine tetraacetic acid (EDTA)), has a yellowness index (YI) that was greatly reduced compared to that of Comparative Example CE1, the PVB/silver nitrate control solution without additives. Moreover, the YI of Example E1 was also reduced compared to those of Comparative Examples CE3 through CE6, which contained a UV absorber, a thermal stabilizer, or a hindered amine, but not a chelating agent.

While certain of the preferred embodiments of this invention have been described and specifically exemplified above, it is not intended that the invention be limited to such embodiments. Various modifications may be made without departing from the scope and spirit of the invention, as set forth in the following claims.

What is claimed is:

1. A solar cell module comprising a solar cell assembly, said solar cell assembly comprising at least one solar cell and an oxidizable metal component, and said solar cell assembly being encapsulated by a poly(vinyl butyral) encapsulant, wherein the oxidizable metal component is in contact with the poly(vinyl butyral) encapsulant and further the poly(vinyl butyral) encapsulant comprises a poly(vinyl butyral) resin, about 15 to about 45 wt % of plasticizer and about 0.5 to about 2 wt % of a chelating agent, based on the total weight of the poly(vinyl butyral).

2. The solar cell module of claim 1, wherein the poly(vinyl butyral) encapsulant has a yellowness index of about 60 or less when measured in accordance with ASTM E313-05 after 1000 hours at 85% relative humidity (RH) and at 85° C. with a bias of 1,000 V.

3. The solar cell module of claim 1, wherein the oxidizable metal component comprises one or more metals selected from the group consisting of silver, cerium, copper, aluminum, zirconium, titanium, bismuth, cadmium, copper, lead, silver, tin, lead, zinc, and alloys comprising one or more of silver, cerium, copper, aluminum, zirconium, titanium, bismuth, cadmium, copper, lead, silver, tin, lead and zinc.

4. The solar cell module of claim 3, wherein the oxidizable metal component comprises silver or an alloy of silver.

5. The solar cell module of claim 1, wherein the oxidizable metal component is selected from the group consisting of conductive pastes, conducting wires, bus bars, conductive coatings and reflector films.

6. The solar cell module of claim 1, wherein the poly(vinyl butyral) encapsulant comprises up to about 1.5 wt % of the chelating agent(s), based on the total weight of the poly(vinyl butyral) encapsulant.

7. The solar cell module of claim 1, wherein the chelating agent is selected from the group consisting of ethylenediaminetetraacetic acid, ethylenediamine monoacetic acid, ethylenediamine diacetic acid, ethylenediamine triacetic acid, ethylene diamine, tris(2-aminoethyl)amine, and diethylenetriaminepentacetic acid.

8. The solar cell module of claim 1, wherein the chelating agent comprises ethylenediaminetetraacetic acid.

9. The solar cell module of claim 1, wherein the poly(vinyl butyral) encapsulant further comprises one or more additives selected from the group consisting of about 0.01 to about 1 wt % of at least one UV absorber; about 0.01 to about 1 wt % of at least one thermal stabilizer; about 0.01 to about 1 wt % of at least one unsaturated heterocyclic compound; and about 0.01 to about 1 wt % of at least one hindered amine, based on the total weight of the poly(vinyl butyral).

10. The solar cell module of claim 9, wherein the UV absorber(s) are benzotriazole derivatives; or wherein the thermal stabilizer(s) comprise octylphenol or butylated hydroxytoluene; or wherein the unsaturated heterocyclic compound(s) are selected from the group consisting of triazole, imidazole, pyrrole, pyridine, purine, pyrazine, adenine, triazine, benzotriazole, benzothiazole, benzoxazole, 2,2'-dipyridyl, 2-mercaptobenzimidazole and thiazole; or wherein the hindered amine(s) are selected from the group consisting of 2,2,6,6-tetramethylpiperadine, 2,2,6,6-tetramethylpiperadinol, 2-(dimethylamino) pyridine, 4-(dimethylamino) pyridine, N-butyl piperidine, N,N-diethyl cyclohexylamine, and hindered amine light stabilizers.

11. The solar cell module of claim 1, wherein the solar cell(s) are wafer-based solar cells selected from the group consisting of crystalline silicon (c-Si) and multi-crystalline silicone (mc-Si) based solar cells.

12. The solar cell module of claim 1, wherein the solar cell(s) are thin film solar cells selected from the group consisting of amorphous silicon (a-Si), microcrystalline silicon (μc-Si), cadmium telluride (CdTe), copper indium selenide (CIS), copper indium/gallium diselenide (CIGS), light absorbing dyes, and organic semiconductor based thin film solar cells.

13. The solar cell module of claim 12, wherein the oxidizable metal component is a reflector film comprising silver or an alloy of silver.

14. A pre-lamination assembly for preparing a solar cell module, said pre-lamination assembly comprising:

a solar cell assembly, said solar cell assembly comprising at least one solar cell and an oxidizable metal component;

a poly(vinyl butyral) sheet having a thickness of about 0.25 mm to about 1.2 mm and comprising a poly(vinyl butyral) encapsulant, said poly(vinyl butyral) encapsulant comprising a poly(vinyl butyral) resin, about 15 to about 45 wt % of a plasticizer and about 0.5 to about 2 wt % of a chelating agent, based on the total weight of the poly(vinyl butyral) encapsulant; and optionally wherein the poly(vinyl butyral) sheet has a yellowness index of about 60 or less, as measured in accordance with ASTM E313-05 after 1000 hours at 85% relative humidity (RH) and at 85° C. with a bias of 1,000 V;

wherein said poly(vinyl butyral) sheet is in contact with said oxidizable metal component.

15. The pre-lamination assembly of claim 14, further comprising one or more additional layers selected from the group consisting of:

a second poly(vinyl butyral) sheet that may be the same as or different from the poly(vinyl butyral) sheet, said second poly(vinyl butyral) sheet being in contact with the solar cell assembly;

a protective outer layer that is in contact with the poly(vinyl butyral) sheet;

a second protective outer layer that may be the same as or different from the protective outer layer, said second protective outer layer in contact with the second poly(vinyl butyral) sheet; and a substrate or a superstrate that is in contact with the solar cell assembly and with the poly(vinyl butyral) sheet.

16. A process for reducing or preventing discoloration of poly(vinyl butyral) encapsulant in a solar cell module, said process comprising the steps of:

providing a poly(vinyl butyral) sheet comprising a poly(vinyl butyral) encapsulant, said poly(vinyl butyral) encapsulant comprising a poly(vinyl butyral) resin, about 15 to about 45 wt % of a plasticizer and about 0.5 to about 2 wt % of a chelating agent, based on the total weight of the poly(vinyl butyral) encapsulant, and optionally wherein the poly(vinyl butyral) sheet has a yellowness index of about 60 or less in accordance with ASTM E313-05 after 1000 hours at 85% relative humidity (RH) and at 85° C. with a bias of 1,000 V;

forming a solar cell module by encapsulating a solar cell assembly in the poly(vinyl butyral) sheet, said solar cell assembly comprising an oxidizable metal component that is in contact with the poly(vinyl butyral) sheet; and operating the solar cell module under a set of conditions for a period of time;

wherein the yellowness index of the poly(vinyl butyral) encapsulant will be unchanged after the period of operation; or wherein the change in the yellowness index of the poly(vinyl butyral) encapsulant after the period of operation is smaller than the change in the yellowness index of a second poly(vinyl butyral) encapsulant after the same period of operation under the same set of conditions in a second solar cell module that is substantially identical to the solar cell module; wherein said second poly(vinyl butyral) encapsulant does not comprise a chelating agent.

* * * * *